United States Patent [19]
Nakanishi

[11] Patent Number: 5,861,898
[45] Date of Patent: Jan. 19, 1999

[54] APPARATUS FOR DETECTING BATTERY VOLTAGE

[75] Inventor: Hideki Nakanishi, Tokyo, Japan

[73] Assignee: Canon Kabushiki Kaisha, Tokyo, Japan

[21] Appl. No.: 557,693

[22] Filed: Nov. 14, 1995

[30] Foreign Application Priority Data

Nov. 14, 1994 [JP] Japan .................................. 6-279255
Nov. 14, 1994 [JP] Japan .................................. 6-279257

[51] Int. Cl.$^6$ ........................... B41J 29/393; B41J 29/38; H01M 10/44
[52] U.S. Cl. ................................. 347/19; 347/17; 347/14; 320/20
[58] Field of Search .................................. 347/19, 17, 14, 347/37; 346/146; 324/433, 426, 427; 320/15, 20, 21; 358/461, 464, 466

[56] References Cited

U.S. PATENT DOCUMENTS

| | | | |
|---|---|---|---|
| 5,157,247 | 10/1992 | Takahira | 235/492 |
| 5,442,283 | 8/1995 | Fuse | 347/19 |
| 5,508,722 | 4/1996 | Saito et al. | 347/17 |

*Primary Examiner*—Robert E. Nappi
*Assistant Examiner*—Rajnikant B. Patel
*Attorney, Agent, or Firm*—Fitzpatrick, Cella, Harper & Scinto

[57] ABSTRACT

By means of MPU6, which is the control means, at the time of production, a reference voltage from an external device is applied to detector means 2 to be detected and converted to a digital signal in A/D converter means 3 and stored in memory means 4; while, at the time of operation, such as printing or image recording, the voltage of a battery equipped in the apparatus itself is applied to detector means 2 to be detected and converted to another digital value by the A/D converter means 3 to be applied to comparing means 5; the digital value of the reference voltage, already stored in memory means 4 is also applied to comparing means 5, and is compared with the battery voltage also stored in memory means 4, thereby it is determined whether the battery voltage will comply with the voltage which is necessary for performing the operation, such as printing operation, of the apparatus. In this process, it is possible to check the battery voltage of a battery-operated apparatus without involving any error.

9 Claims, 5 Drawing Sheets

APPARATUS FOR DETECTING BATTERY VOLTAGE

BACKGROUND OF THE INVENTION

1. Field of the Invention

The present invention relates to an apparatus for detecting the battery voltage which decreases below the value of the reference voltage.

2. Brief Description of the Prior Art

In recent years, there have been increased number of apparatus driven by the battery. The same tendency is seen also in the field of office machines, and there are many types which are driven by the battery equipped in the own apparatus for the reason of small-sized and portable requirement. The battery voltage can be sometimes lowered to cause the apparatus not to perform the normal operations. Accordingly, it is also provided with some apparatus, which are equipped with a battery voltage detecting device for detecting whether the battery voltage is lowered below the reference voltage value, that is, the low battery condition, to prevent the above-mentioned disadvantage.

FIG.5 is the block diagram of a conventionally typical low battery detecting system in a recording apparatus. Hereinafter, it is described the operation sequence thereof:

(1) sampling the terminal voltage $V_{battery}$ of a battery 9 by the detector means 2 in timing of every printing operation;

(2) converting the detected voltage $V_{battery}$ to a digital value $X_{battery}$ by the A/D converter means 3;

(3) comparing means 5 compares $X_{battery}$ with a predetermined value $X_{low}$; and (4) based on the result above, a microprocessing unit determines whether the condition of the battery is low battery or not, whereby usually, when $X_{battery}$ is lower than $X_{low}$, the low battery condition is decided.

In the foregoing description, the timing of every typing operation is referred to the timing of which the same load is periodically applied, such as during the paper feed operation at printing of a plurality of cut papers. Also, the predetermined value $X_{low}$ is in advance stored in a mask ROM or EEP-ROM in the apparatus, and, in such a ROM, a variety of data for controlling the printing operation, in addition to the threshold value of low battery, are stored.

Most of the recent recording apparatus are provided with functions such as high resolution printing or low noise drive, and requirements for the power supply system, particularly for safety thereof, have been becoming severe. Accordingly, the low battery detection is also required to be performed with relatively high accuracy.

However, there have been the problems relating to detection accuracy in the low battery detecting construction.

When the foregoing construction is equipped in the products of mass production, printers having dispersion in detection accuracy based on the ability tolerance of used components in every location ranging from "voltage observation" to "low battery analyzing system", to produce an undesired factor to decrease the low battery accuracy. Namely, even between the products of the same model, the products which correctly detect the voltage drop condition of a low battery are mixed with those which do not correctly detect the same condition.

In other words, there has been a fear of mis-recognition of low battery detection to perform printer operation regardless of the state of low electromotive force of the battery, and therefore the above-mentioned function could not be sufficiently achieved.

Such a mis-recognition of the low battery state caused by the detection error can lead to an erroneous operation control of products, which can connect with some of disadvantages. For example, in the case of a battery power driven printer, if a proper detection of the battery is not be performed, sometimes a sudden stop of the printing operation can occur halfway in the cut paper during printing.

In addition, for fine adjustment of the detection mechanism, usually a trimmer potentiometer (variable resistor) is used. This method requires a mechanical adjustment for every product, thereby involving a troublesome manual operation in production.

In summary, in view of production process, there has been until recently no way for the equipment of a high precision battery detection mechanism, which is indispensable for realizing a high performance printing, in a recording apparatus through an efficient method.

SUMMARY OF THE INVENTION

In view of the above-described problems, the present invention has been made. Accordingly, an object of the invention is to provide an improved battery voltage detecting device, and also a recording apparatus equipped with such an improved battery voltage detecting device.

Another object of the present invention is to provide a battery voltage detecting device capable of easily detecting, without involving any error, that the voltage of a battery equipped in the apparatus itself is lowered below the reference voltage, and also a recording apparatus equipped with such a battery voltage detecting device.

A further object of the present invention is to provide a battery voltage detecting device capable of properly and easily detecting that the battery voltage is lowered below the reference voltage without involving any relative error which can occur between each apparatus being manufactured, through the steps of: receiving a reference voltage from an external reference voltage circuit during the production time; memorizing the reference voltage, as a reference voltage value data, within a detector means of the apparatus itself and, also to provide a recording apparatus equipped with such a battery voltage detecting device.

A still further object of the present invention is to provide a battery voltage detecting device capable of easily detecting that the battery voltage is lowered below the reference voltage without involving any error, through the processes of receiving a voltage from a reference voltage circuit provided in the plant during the production time at the plant and storing such voltage in a memory means as the reference voltage value data; applying the voltage of the battery equipped in the apparatus itself to a detector means to be detected, A/D converted, and applied to a comparing means, and applying also the reference voltage value data already stored in the memory means to the same comparing means above, and the digital values of both the battery and reference voltage are compared in the comparing means, and, also provide a recording apparatus equipped with such a battery voltage detecting device.

Other objects and features of the invention will become apparent from the following description and drawings.

DETAILED DESCRIPTION OF THE INVENTION

Hereinafter, the description is made in detail on the embodiments according to the present invention with reference to the accompanying drawings.

Figure 4:
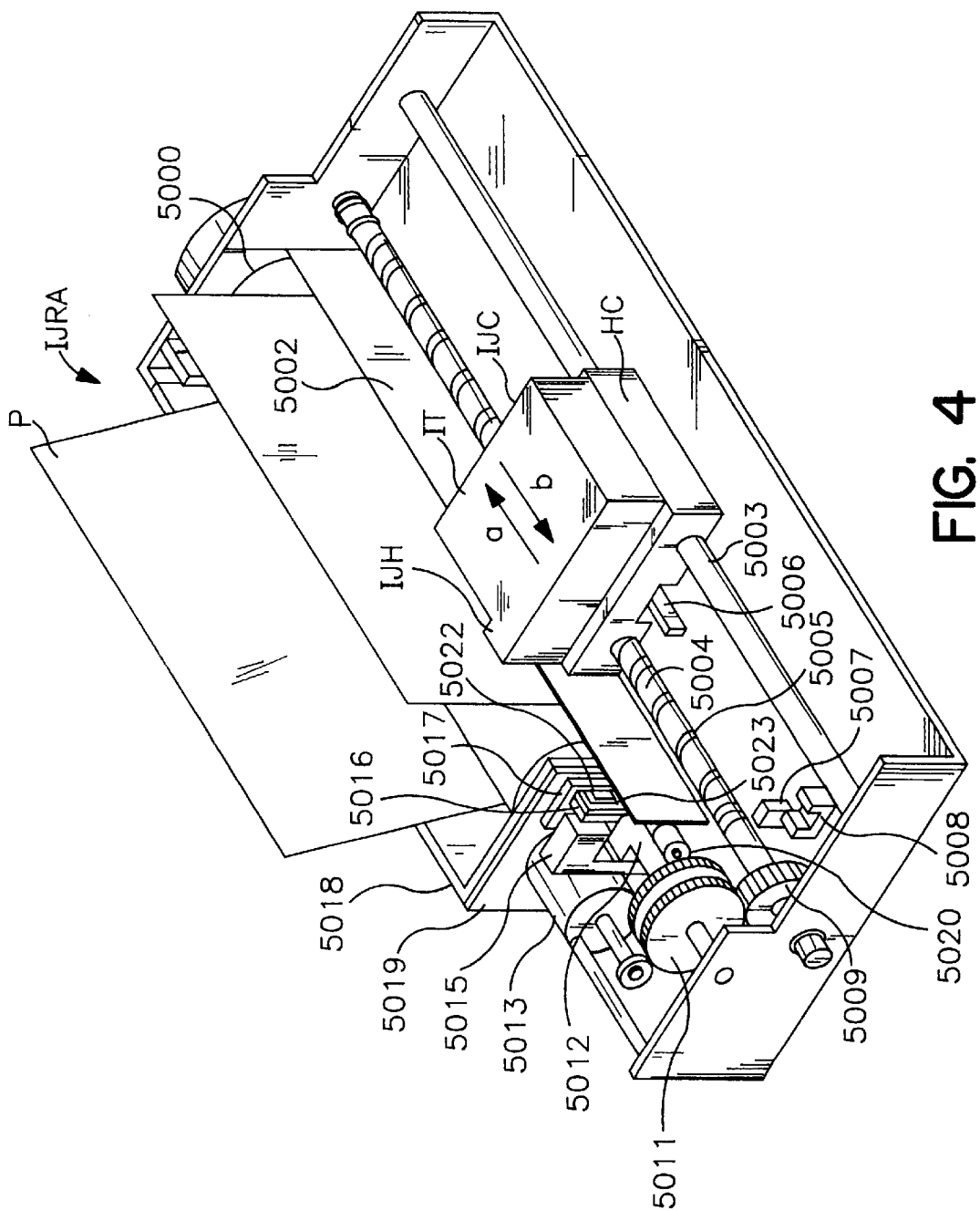
FIG. 4 is a perspective view of a recording apparatus for which the present invention is applicable.
Figure 5:
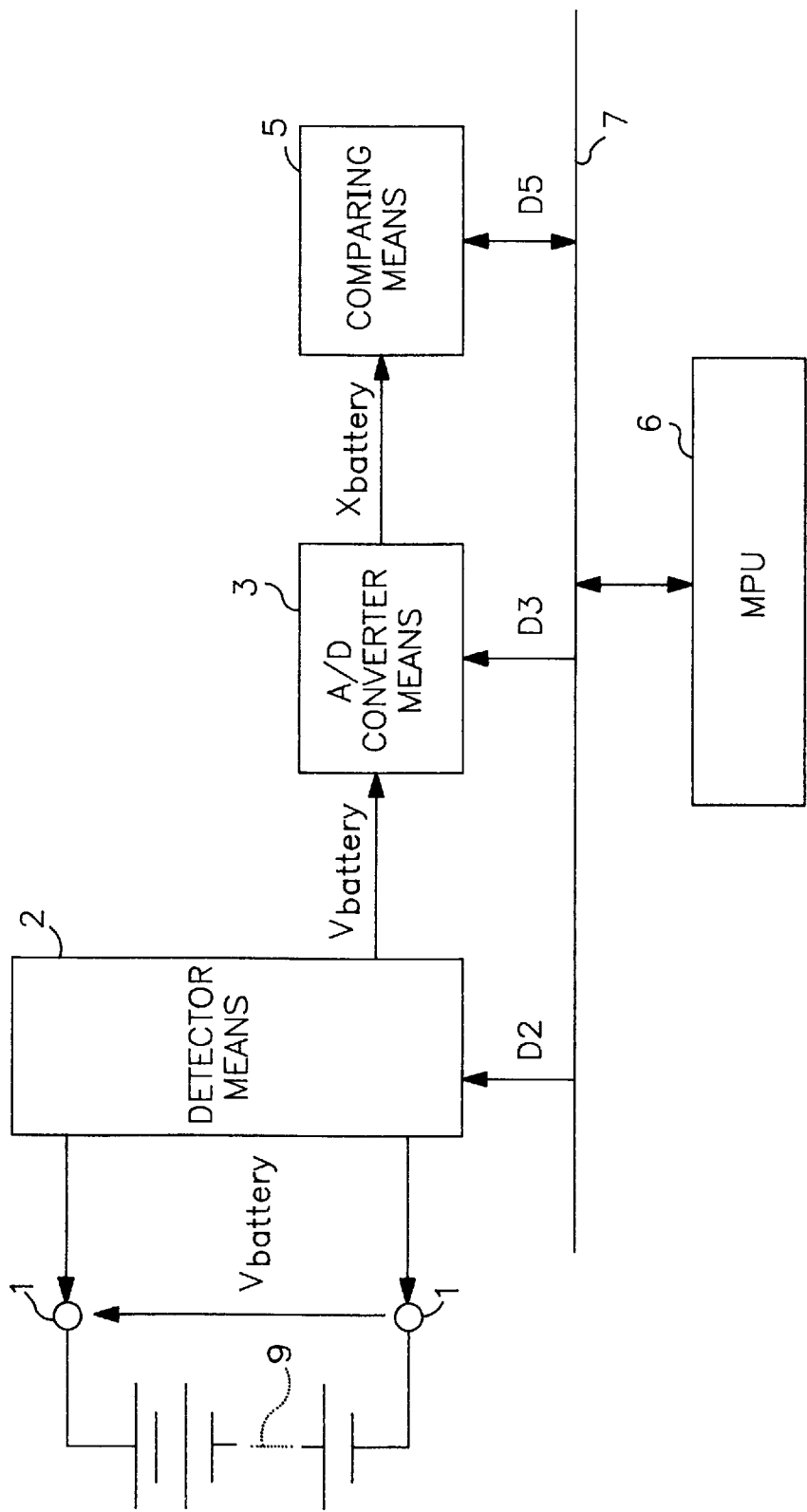
FIG. 5 is a block diagram of an example of the conventional recording apparatus.

FIG. 4 is a perspective view of a portable type ink jet recording apparatus for which the present invention is applicable. In FIG. 4, a carriage HC, which is engageable with a spiral groove 5004 of a lead screw 5005 which is rotatable in conjunction with the clockwise and counterclockwise rotation of an actuating motor 5013 and through an actuation force transferring gear set 5009 to 5011, has a pin (not shown) and is thereby reciprocally moved in the direction of a or b. Mounted on the carriage HC is an integrated ink jet cartridge IJC, which encloses a recording head IJH and an ink tank IT. In this embodiment, the recording head IJH is a head of the type of causing a state conversion of the ink by thermal energy for injecting the ink from an outlet opening. A reference numeral 5002 is a plate for supporting a paper sheet, which presses the paper sheet against a platen 5000 along the moving direction of the carriage. A photo-coupler including numerals 5007 and 5008 is a position detector for confirming the existence of a lever 5006 of the carriage in this area, and then performing selection of the rotating direction of the motor 5013 and other operations. A numeral 5016 is a member for supporting a cap member 5022 which caps the front face of recording head IJH, and a numeral 5015 is an absorber for absorbing the cap toward inside, thereby performing suction recovery of the recording head through a cap inside opening 5023. A cleaning blade 5017 and a member 5019 for allowing the forward and backward movement of this blade, both of which are supported on a body support member 5018. Of course, any of known cleaning blades other than the above is applicable in the present embodiment. A lever 5021 for initiating an absorbing action for causing absorption recovery can move in accordance with the movement of a cam 5020 which engages the carriage, and thereby the actuating force is movably controlled by means of a conventional transmission mechanism, such as a clutch selection mechanism.

The apparatus is constructed so that, among these operations including capping, cleaning and absorption recovery, a desired operation is dealt with, when the carriage reaches within the area of the home position side, under the function of lead screw 5005 and at the position corresponding to the selected one of the operations above. In addition, any example being constructed so that a desired operation is performed with a known timing is also applicable for the present embodiment.

Figure 1:
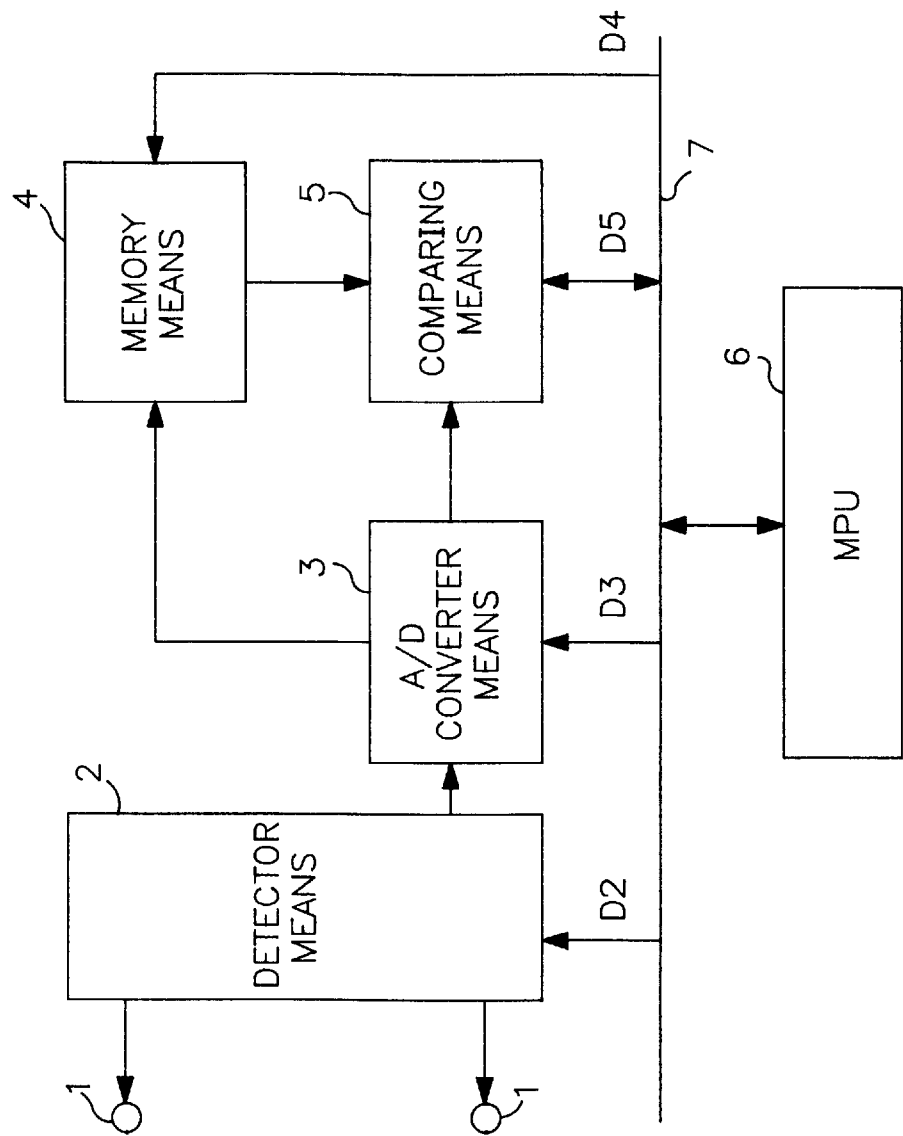
FIG.1 is a block diagram of a low battery detector device of an embodiment of the present invention.

The ink jet recording apparatus having the aforementioned construction is, since the power consumption thereof is few enough, especially suitable as an apparatus powered by a battery, that is, a secondary battery. FIG. 1 is a block diagram of a low battery detection device for a battery equipped in a recording apparatus.

The detection device comprises a detection terminal 1 for detecting the terminal voltage of a battery, detecting means 2 for reading the voltage applied on the terminal 1, an A/D converter 3 for converting the detected voltage to a digital value, a memory 4 in which the low battery level (threshold level) of the battery is stored, means 5 for comparing the terminal voltage (digital value) and the low battery level, a MPU 6 for overall control of the components, and a bus line 7 to form a network including CPU and other components.

The above construction is part of the printer components, and there are also an actuation system for the printing operation or the other functions (not shown). The MPU 6 may be also of commonly used for the MPU for controlling the main operation, that is recording operation. The memory 4 should be satisfied by the following two conditions.

a. Enabled to be written in by the external input application, and b. Constructed so that the internal memory would not erased even the power supply is shut off.

Since, in most cases, in order to store a various control data in the recording apparatus, EEP-ROM's are installed, these may be most preferably utilized.

Figure 2:
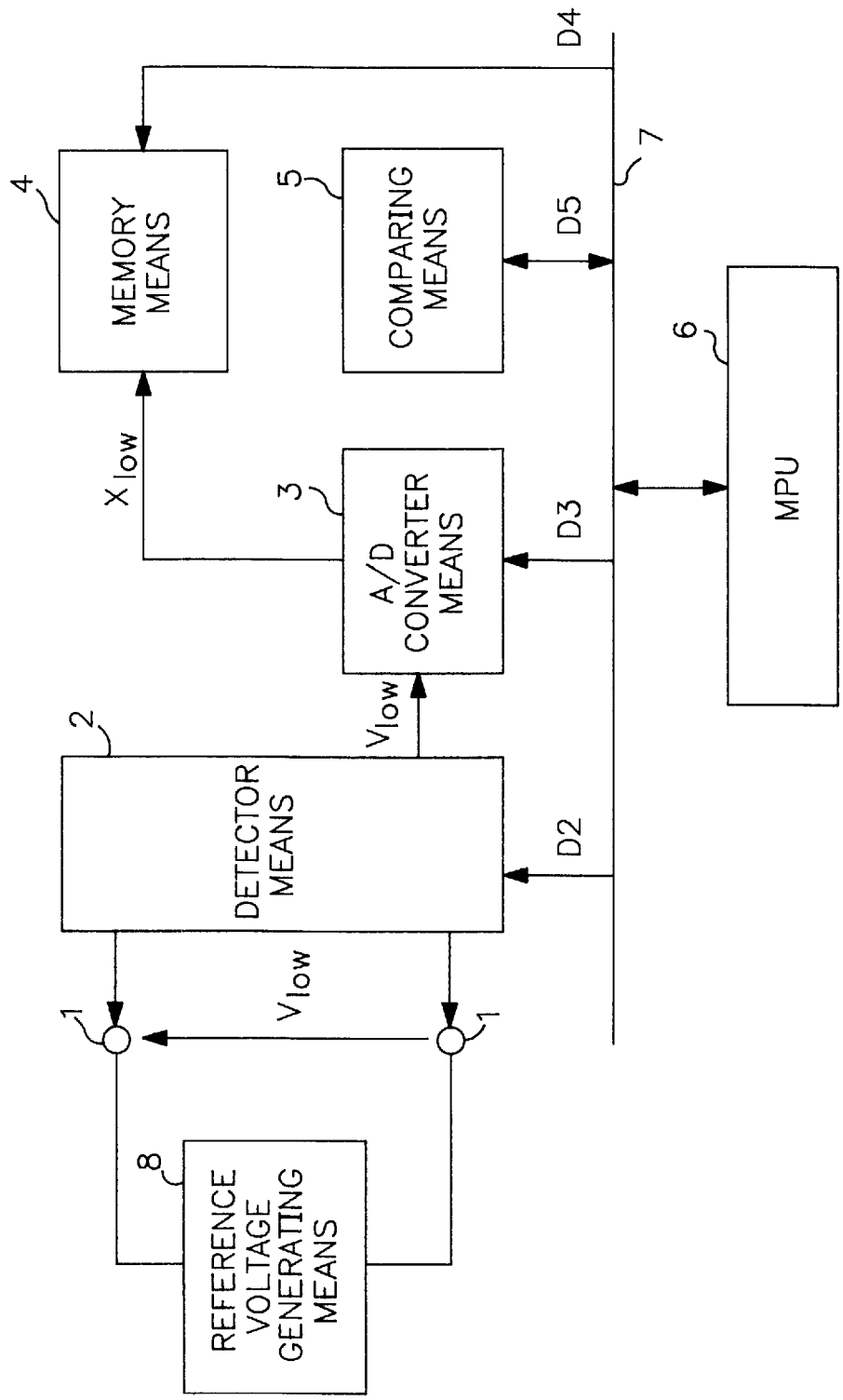
FIG.2 is a block diagram of explaining a read-in of the reference value of the embodiment in FIG.1.

Referring now to FIG. 2, it is described the steps of reference read-in operation for error correction of the low battery detection performed against each one product of manufactured products:

(1) Connecting the reference voltage generating means 8 enabling to apply with a voltage having a predetermined level to the terminal 1;

(2) By means of such as a key operation, allowing the MPU to transmit an instruction D for the detector means 2 to perform sampling of the voltage values $V_{low}$ which are applied by the reference voltage generating means 8;

(3) The detected voltage value $V_{low}$ is transferred to A/D converter 3, and is converted to a digital value $X_{low}$; and (4) The converted value $X_{low}$ is transmitted to memory 4, and memorized within the memory 4.

The voltage value $V_{low}$ applied by the reference voltage generating means 8 is to be a threshold value for performing low battery detection.

Figure 3:
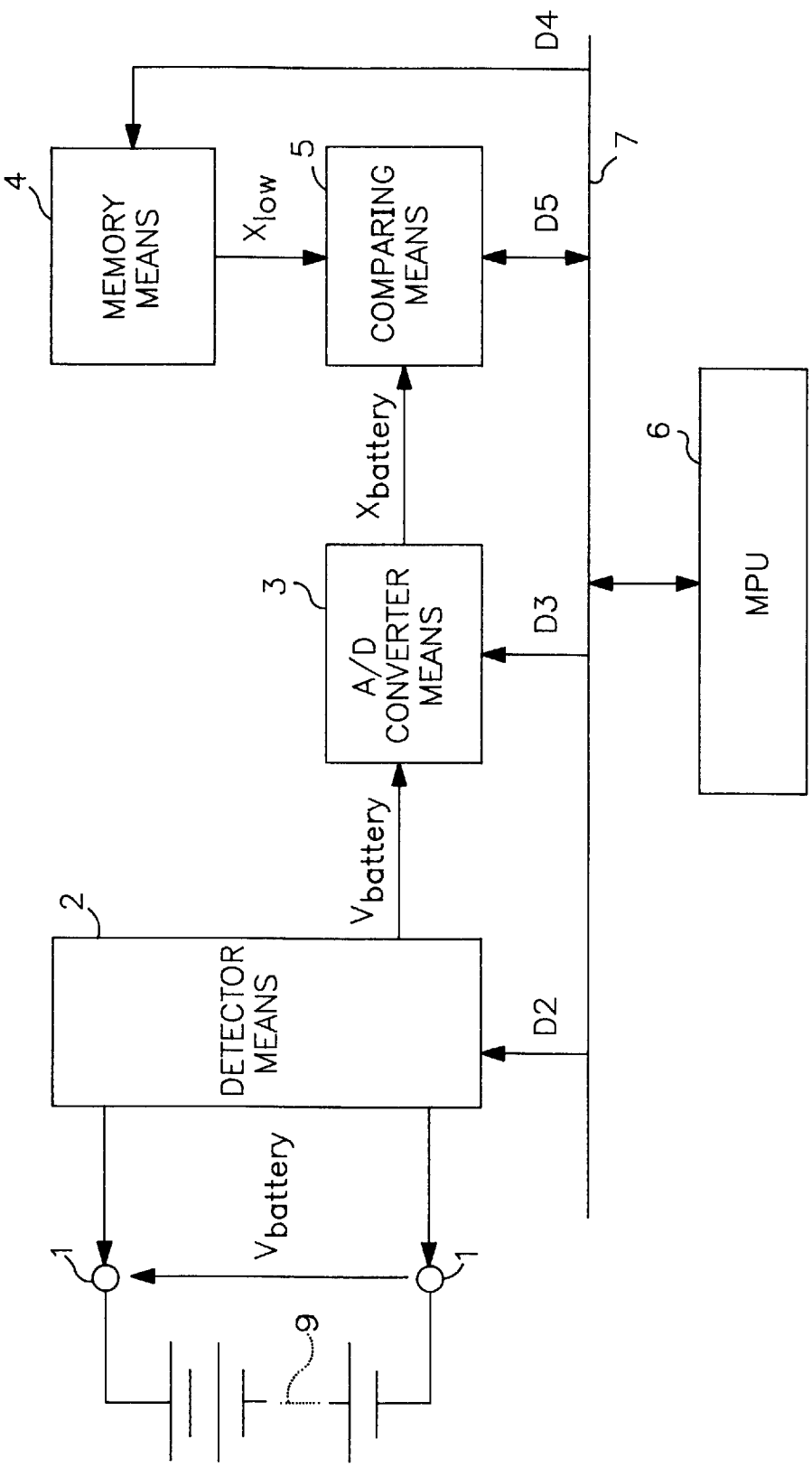
FIG. 3 is a block diagram explaining the low battery detection time of the embodiment in FIG. 1.

Referring now to FIG. 3, low battery detection sequence performed by the low battery detection device at the time of printing operation is hereinafter described:

(1) The terminal voltage $V_{battery}$ of the battery 9 in the embodiment is sampled by the detector means 2, in timing of each printing action;

(2) The detected $V_{battery}$ is converted to a digital value $X_{battery}$;

(3) The comparing means 5 compares the value $X_{battery}$ with the value $X_{low}$ which is memorized in memory 4 at the plant production; and (4) On the basis of the result of comparison, MPU 6 determines whether the battery is low battery state or not, where, if $X_{battery}$ is lower than $X_{low}$ the state is deemed low battery.

Several explanations are further added herein. The timing in (1) above is referred to any timing which the load applied to the battery periodically becomes the same accumulated load, which can be found e.g. in the time of paper feed in the course of printing a number of cut papers.

In the aforementioned process, the electrically applied voltage value $V_{low}$ for each of products is written in the memory by means of software control, which value is used as the threshold value, to perform low battery detection. At this time, since the input route for the threshold value in the electric circuit and the voltage detection route for low battery detection is the same as to each other, the above-described detection system provides the almost no detection error which has been inevitable in the products through mass-production. In addition, the value of $X_{low}$ is stored for each product with a value which is different from each other.

Moreover, since the correction of detection accuracy is of software means, it does not become a great load or work on the production process of the recording apparatus.

Although the description above has been limited in the ink jet recording apparatus, it is not limited herein, and it may be applied for any of the apparatus powered by the battery.

What is claimed is:

1. A battery voltage detection device, equipped in an apparatus using a battery, for detecting whether the voltage of the battery is lowered below a reference voltage, said device comprising:

detector means for separately detecting the reference voltage from an external device and the voltage of the battery to generate respective analog values of the reference voltage and the battery voltage;

A/D converter means for converting the respective analog values detected by said detector means to respective digital values;

memory means for storing the digital value of the reference voltage converted by said A/D converter means;

comparing means for comparing the digital value of the battery voltage with the digital value of the reference voltage stored in said memory means; and control means for controlling operation of each of said detector means, A/D converter means, memory means and comparing means, and for further controlling the principal operation of said apparatus, wherein said control means instructs said detector means to sample the reference voltage in response to receiving an instruction for reading-in the reference voltage:

the reference voltage sample is converted to a digital value by the A/D converter means and stored in said memory means;

during principal operation of said apparatus, said detector means samples the battery voltage at a specified time, said A/D converting means subsequently A/D converts the battery voltage sample, and the comparing means compares the digital value of the battery voltage with the digital value of the reference voltage, and corresponding to a result of said comparing means, said control means judges whether or not the battery voltage is adequate.

2. A battery voltage detection device according to claim 1, wherein the content of said memory means is maintained without being erased, even though the power supplied from the battery is turned off.

3. A battery voltage detection device according to claim 1, wherein said memory means includes an EEP-ROM.

4. A recording apparatus powered and operated by a battery equipped within said apparatus and performing printing operation in accordance with printing data, said apparatus comprising:

detector means for separately detecting a reference voltage from an external device and the voltage the battery to generate respective analog values of the reference voltage and the battery voltage;

A/D converter means for converting the respective analog values detected by said detector means to digital values;

memory means for storing the digital value of the reference voltage converted by said A/D converter means;

comparing means for comparing the digital value of the battery voltage with the digital value of the reference voltage stored in said memory means; and control means for controlling operation of each of said detector means, A/D converter means, memory means and comparing means, and for further controlling the principal operation of said apparatus, wherein said control means instructs said detector means to sample the reference voltage in response to receiving an instruction for reading-in the reference voltage;

the reference voltage sample is converted to a digital value by the A/D converter means and stored in said memory means;

during principal operation of said apparatus, said detector means samples the battery voltage at a specified time, said A/D converting means subsequently A/D converts the battery voltage sample, and the comparing means compares the digital value of the battery voltage with the digital value of the reference voltage;

and, corresponding to a result of said comparing means, said control means judges whether or not the battery voltage is adequate.

5. A recording apparatus according to claim 4, wherein the content of said memory means is maintained without being erased, even though the power supplied from the battery is turned off.

6. A recording apparatus according to claim 5, wherein said memory means includes an EEP-ROM.

7. A recording apparatus according to claim 4, further comprising a recording head for performing printing operation in accordance with printing data.

8. A recording apparatus according to claim 7, wherein the recording-head is an ink jet recording head injecting ink droplets in accordance with printing data.

9. A recording apparatus according to claim 8, wherein the recording head utilizes thermal energy to cause a state conversion of ink for injecting ink droplets from an outlet opening.

* * * * *